United States Patent
Wheable

[15] 3,665,457

[45] May 23, 1972

[54] ANALOG TO DIGITAL CONVERTER

[72] Inventor: Desmond Wheable, Farnborough, England

[73] Assignee: The Solartron Electronic Group Limited, Farnborough, Hampshire, England

[22] Filed: Oct. 2, 1968

[21] Appl. No.: 764,489

[30] Foreign Application Priority Data

Oct. 4, 1967 Great Britain ....................45,281/67

[52] U.S. Cl. ....................340/347 NT
[51] Int. Cl. ....................G09b 13/00
[58] Field of Search ....................340/347

[56] References Cited

UNITED STATES PATENTS

| | | | |
|---|---|---|---|
| 3,462,758 | 8/1969 | Reynal | 340/347 |
| 3,458,809 | 7/1969 | Dorey | 340/347 |
| 3,436,756 | 4/1969 | Myers | 340/347 |
| 2,897,486 | 7/1959 | Alexander | 340/347 |
| 3,525,093 | 8/1970 | Marshall | 340/347 |
| 3,296,613 | 1/1967 | Andersen et al. | 340/347 |
| 3,577,140 | 5/1971 | Aasnaes | 340/347 |

OTHER PUBLICATIONS

Triple Play Speeds A- d Conversion Aasnaes & Harrison Electronics April 29, 1968 pages 69- 72

*Primary Examiner*—Maynard R. Wilbur
*Assistant Examiner*—Jeremiah Glassman
*Attorney*—William R. Sherman, Stewart F. Moore, Jerry M. Presson and Arnold, Roylance, Abrams, Berdo and Kaul

[57] ABSTRACT

A successive approximation type of analog to digital converter is disclosed which combines the advantages of high linearity, high precision and high speeds of digitization which are characteristic of converters of this type, with certain important advantages which are characteristic of analog to digital converters of the integrating type; specifically, good common or series mode rejection.

8 Claims, 2 Drawing Figures

ANALOG TO DIGITAL CONVERTER

This invention relates to successive approximation analog to digital converters (ADC's), also known as digital voltmeters since their primary use is in measuring voltage. Successive approximation ADC's are well known (see for example, Computer Handbook, Huskey and Korn 1962 page 18.32 to 18.34) and have the advantages of speed of digitization (only 12 logical decisions are needed to encode to 1 part in 1,000) and of high linearity and precision, essentially determined by the precision of the resistors and voltage standard employed. However they use expensive components and are susceptible to series-mode interference, much of which is that due to mains hum at 50 or 60Hz and harmonics thereof, which is apt to cause errors in a measurement. It is however known that integrating type ADC's are less susceptible to series-mode interference, such ADC's being typically operated with an integrating period equal to that of one or more mains periods, the net integral of mains hum over such a period being zero.

The object of this invention is to provide a successive approximation ADC which incorporates the advantages of an integrating type ADC.

According to the present invention there is provided a successive approximation analog to digital converter comprising an integrating circuit and means for applying an input voltage thereto for a predetermined interval of time. Means are provided for reducing the output level of the integrating circuit, so as to generate ramp voltages in timed relationship with clock pulses. The last said means are arranged to operate in a succession of at least three ranges in which the mean slopes of the ramp voltages decrease in magnitude from range to range by a factor N, (which will be 10 for the ordinary case of decade ranges), and in each of which ranges the ramp restores the output of the integrating circuit to the datum level to within the approximation possible in that range.

The number of clock pulses occurring during the course of the ramp voltage in each range is counted and numbers corresponding to the numbers of clock pulses counted in the successive ranges are separately indicated.

Each ramp voltage may take the form of a stepped approximation thereto, (i.e. a staircase ramp). The function will ordinarily have a linear slope though this is not necessarily the case.

In analogous fashion to known successive approximation ADC's, pulses can be counted in each range until overbalancing or ramp overshoot occurs. There are then two alternatives. One is to subtract the pulse and the corresponding part of the ramp which caused overbalancing before going on to count pulses in the next range. The second, and preferred, alternative is to leave the system over balanced and indicate one less than the number of pulses actually counted in the first range and to make the ramp of opposite polarity in the next range, pulses being counted until the system overbalances in the opposite sense. Assuming decade ranges, the number which has to be indicated for this second range is the 9's complement of one less than the number of pulses actually counted (i.e. the 10's complement of the number actually counted). In the third range the ramp is of the original polarity of the first range and the number which has to be indicated is one less than the counted number, and so on if there are more than three ranges. The embodiment of the invention now to be described operates in the manner outlined above.

This embodiment will be described by way of example, with reference to the accompanying drawings, in which.

Figure 1:
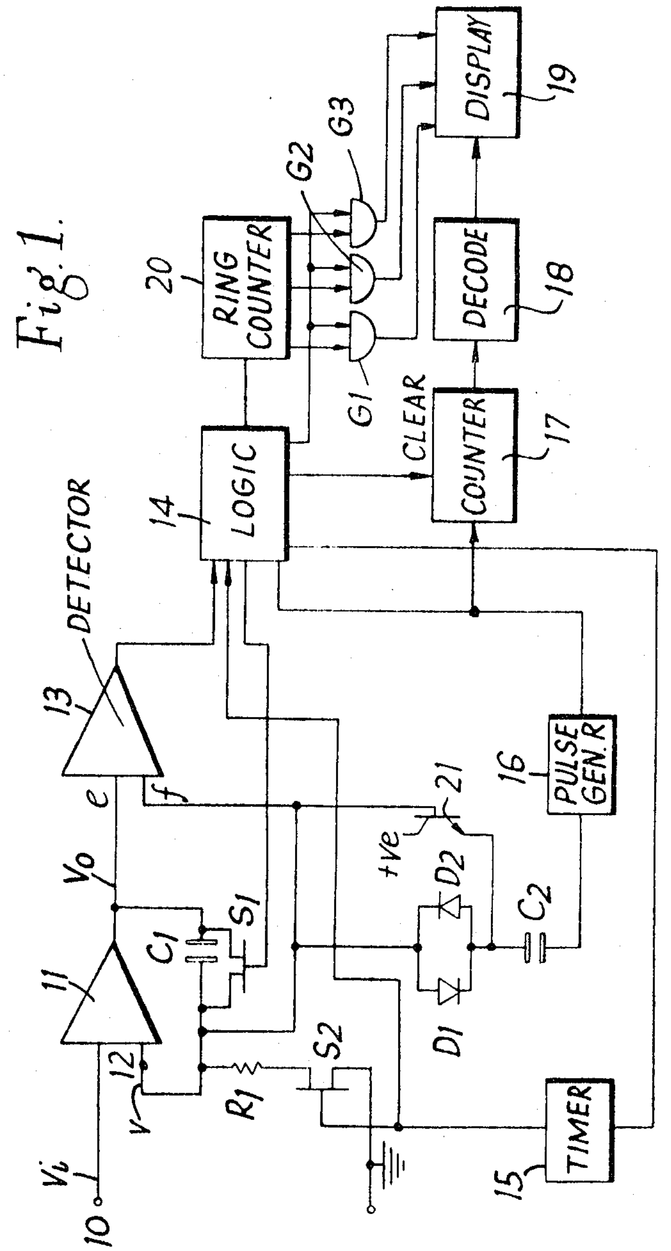
FIG. 1 is a block diagram of one embodiment of the invention.

Referring to FIG. 1 the input voltage to be converted, V*i* is applied to an input terminal 10 of a differential operational amplifier 11 adapted to operate as an integrating amplifier by virtue of a capacitor C1, connected between the output of the amplifier and its differential input terminal 12.

The output from the amplifier is also applied to one input terminal *e* of a zero detector 13. This detector is a differential amplifier and its output indicates which of the two input terminals *e* and *f* is at the higher potential.

In operation, initially a semiconductor switch S1 is closed across C1 and so that the input terminal 12 is at the input potential at terminal 10 by virtue of the feedback from the output of the amplifier, and a switch S2 is open. To initiate a measurement S1 is opened by means of a logic circuit 14 and S2 is closed by a timer 15, which in its simplest form could be a monostable multi-vibrator. However the timer could also be a pulse counter counting master clock pulses provided by a pulse generator 16 referred to below.

The signal at the output of the integrator 11 now ramps up at a rate dependent upon the magnitude of the input voltage, V*i* and the time constant R1 C1, where R1 is a resistor connecting the terminal 12 to earth through S2. The timer 15 determines the integration time, which would typically be 20 m.secs. (1 mains period at 50Hz).

At the end of this integrating period S2 is opened, and at this instant in time the charge on the capacitor C1 is proportional to the integral of the input voltage over the period determined by the timer 15. The input terminal *e*, of the detector 13 is at the input voltage (including its series-mode voltage) plus the voltage across C1, while the terminal *f* of the detector, which is connected to the terminal 12, is at the input voltage plus its series-mode noise voltage. The difference between the magnitudes of the two signals is thus the value of the voltage across C1, i.e. the integral of the input voltage V*i*.

The potential V*o* on the terminal *e* can be derived as follows. If $v$ is the potential on terminal 12 we have $v = Vo \cdot R/(R + 1/Cs)$ where $R$ and $C$ are written for R1 and C1 and $s$ is the operator $d/dt$. But $v - Vi = 0$ and so $Vo = -(1 + RCs) \cdot Vi/RCs = -Vi - 1/RCs \cdot Vi$.

It will be seen that any method used to discharge the capacitor C1 will cause the detector 13 to trigger the logic circuit 14 when the charge on the capacitor C1 goes through zero.

In this embodiment C1 is discharged as follows: Pulses from a pulse generator 16 are fed to C1 through a capacitor C2 and a diode D1 or D2. The polarity of the pulses is so arranged as to discharge C1 towards zero in equal steps dependent upon the ratio of C1 and C2 and the amplitude of the pulses from the pulse generator 16. The output of the integrator will be a staircase waveform. When the charge on the capacitor C1 passes through zero the detector 13 is operated and the logic circuit 14 causes a reversal of the polarity of pulses from the generator 16 and a 10:1 reduction in their amplitude.

The output of the integrator will now follow a staircase ramp in the reverse direction with steps one-tenth the amplitude of the previous decade.

When the capacitor C1 again passes through a zero-charge state the detector 13 operates and the logic circuit 14 again causes a reversal in polarity of the pulses from the generator 16 and a further reduction in the amplitude by 10:1. This sequence of operations is repeated for each decade and for as many digits as are required.

At the beginning of each ramp the logic 14 clears a single decade counter 17 which then counts pulses from the generator 16. Each time the detector is operated the number in the counter 17 is decoded in a decoder 18 and displayed in the appropriate decade of the display 19 as determined by gates G1, G2, G3, etc., and a ring counter 20.

As the voltage across C1 at the end of the integration time is directly proportional to the integral of the input voltage over that time and as the charge left on C1 after the staircase operation is less than one least significant digit, the display will indicate a reading proportion to the integral of the input voltage over the integration time.

Since the virtual earth input to the amplifier 11 does not remain at earth potential it is necessary to D.C. restore the output of the capacitor C2 to the potential on terminal 12. This is effected by a transistor 21 acting as a unity gain amplifier.

The arrangement for displaying the decimal digits can be as described in detail in the specification of co-pending application Ser. No. 730,038, assigned to the same assignee as the present application.

The operation of the pulse generator 16 may also be much as described as in that application. However further description will now be given of the operation of the logic 14, generator 16, and the counter 17.

Figure 2:
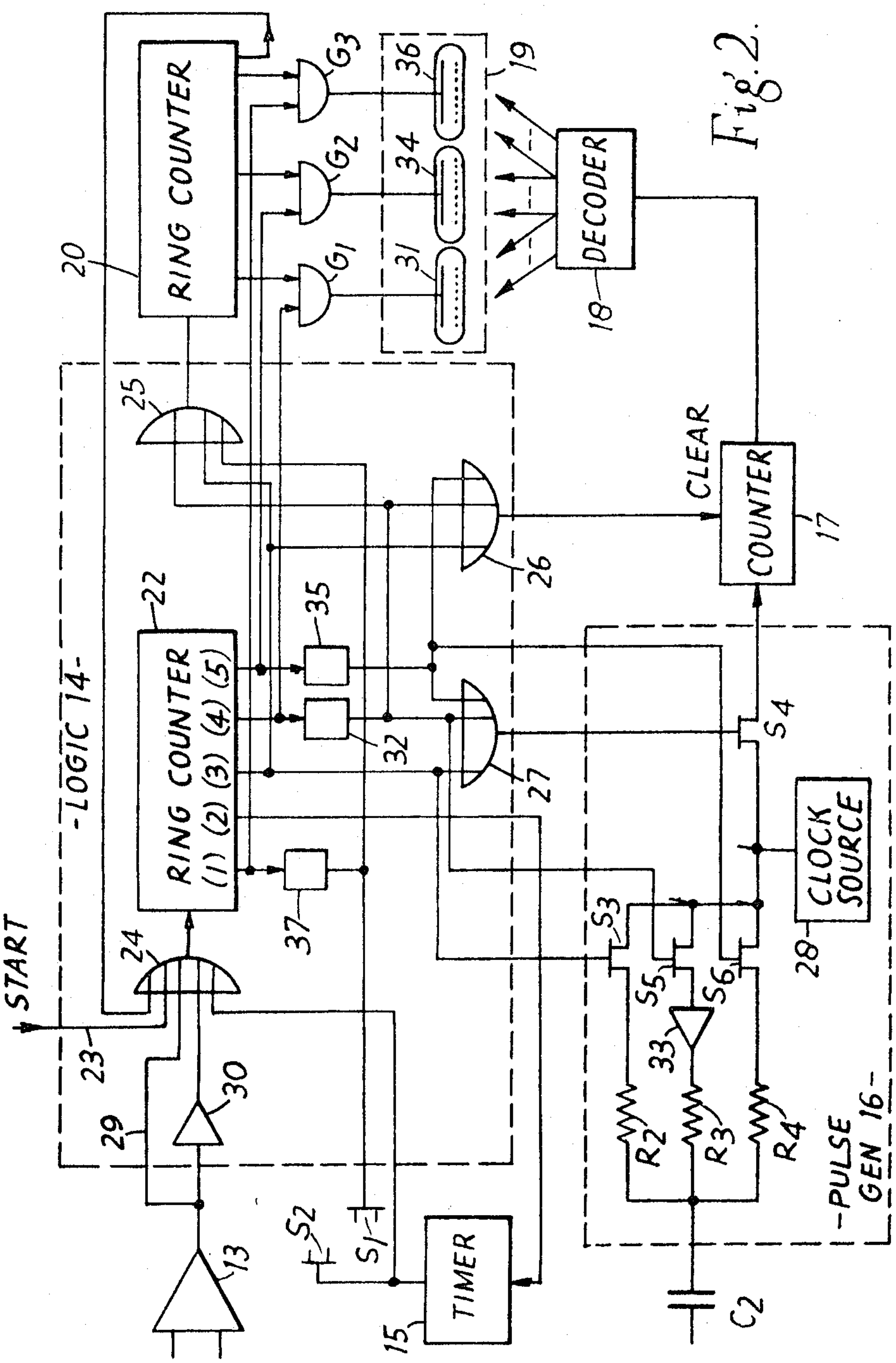
FIG. 2 shows part of FIG. 1 in more detail.

Referring to FIG. 2 the main component of the logic 14 is a five-stage ring counter 22 with outputs 1 to 5. Initially 1 is at a relatively high potential level corresponding to a one-bit and closes S1. A reading is initiated by pressing a switch for example to provide a signal on line 23 which passes through an OR gate 24 to step the counter 22 whose output 2 now starts the timer 15. The timer 15 then goes through a timing cycle which establishes a fixed time period during which S1 and S2 are operated to cause the integrating circuit to integrate the unknown input signal V*i*. At the end of this period the timer 15 resets and terminates the integration. When the timer 15 resets its trailing edge steps the counter 22 again through the OR gate 24 and the counter output 3 goes to the high, 1-bit level. This output operates through an OR gate 25 to step the ring counter 20, which is a four stage ring counter, to prepare the AND gate G1 to open. The output 3 also clears the counter 17 through an OR gate 26, closes a switch S3 and closes a switch S4 through an OR gate 27.

Pulses from a clock source 28, such as an astable multivibrator, pass through the switch S4 to the counter 17. These pulses also pass through the switch S3 and a first scaling resistor R2 to the capacitor C2.

The output of the differential amplifier detector 13 is applied to the OR gate 24 by a direct path 29 and also through an inverter 30 so that, irrespective of which direction the charge on C1 goes through zero or ground potential, the ring counter 22 is stepped. At the end of the first staircase ramp therefore the output 4 of the counter 22 goes to the high one-bit level and opens the gate G1 to pulse the anode of a first number display tube 31 in the display 19. This number tube thereupon displays the most significant digit of the reading in accordance with the cathode thereof energized in known manner by the decoder 18.

The output 4, after an interval sufficient to illuminate the number tube, operates through a delay network 32 to step the counter 20, clear the counter 17, reclose the switch S4 and close a switch S5. The closure of this latter switch initiates a second staircase ramp, whose slope is only one tenth that of the first such ramp, by passing the pulses from the clock source 28 through an inverter 33 and another, larger scaling resister R3. The inverter 33 inverts the slope of this ramp. When the charge on C1 again goes through zero the ring counter 22 steps and gate G2 opens briefly to display the second most significant digit in accordance with the number in the counter 17 on a number tube 34. After a delay provided by network 32, the ring counter 20 steps, the counter 17 is cleared, S4 is reclosed and a switch S6 is closed to apply the pulses from the source 28 to the capacitor C2 through a third, still larger scaling resister R4. At the end of the third staircase ramp thus generated the counter 22 steps to output 1 which firstly causes display of the third digit on a tube 36 by opening gate G3. After a delay provided by network 37, output 1 steps the ring counter 20 to its fourth or rest state and closes S1. A measurement cycle has now been completed.

In order to provide for continuous measurement and display the fourth output of the ring counter 20 feeds back to the OR gate 24 so that another measurement cycle immediately starts.

The above described relationships between the numbers in the counter 17 and the numbers actually to be displayed in each decade are readily achieved by appropriately connecting the ten outputs of the decoder 18 to the cathodes of the tubes 31 and 34 and 36 . Thus if the numbers in the counter 17 at the ends of the three staircase ramps are N1, N2 and N3 respectively, the tubes 31, 34 and 36 will be connected to display N1 – 1, 10 – N2 and N3 – 1 respectively.

The switches S3, S5 and S6 need not be connected to the output of the clock source 28. They can be connected to a reference voltage to produce linear ramps, rather than staircase ramps, which ramps are however timed by the clock pulses so that, at the end of each ramp the number in the counter 17 still represents the magnitude of the ramp.

What is claimed is:

1. An analog to digital converter comprising the combination of an integrating circuit having an input and an output; means for applying an analog signal to the input of said circuit for a predetermined interval of time to cause the output of said circuit to ramp away from a datum level; means for subsequently applying additional signals to the input of said integrating circuit to reduce the level of the output of said circuit toward said datum level in a succession of voltage ramps, each of said ramps including a plurality of fixed magnitude voltage steps, each of said ramps after the first having steps which are equal to the steps in the preceding ramp divided by a factor N, resulting in a mean slope equal to the slope of the preceding ramp divided by a factor N, said means for subsequently applying additional signals including means for reversing the direction of the ramp voltage from one voltage ramp to the next by reversing polarity of said additional signals; means for generating clock pulses in timed relationship with said voltage ramps; means responsive to the output of said integrating circuit for terminating each said voltage ramp when the output of said integrating circuit is restored to within a preselected approximation of said datum level and means for counting the number of clock pulses occurring from the beginning of each voltage ramp to the termination thereof.

2. An analog to digital converter according to claim 1 and further comprising means for individually indicating numbers corresponding to the numbers of clock pulses counted during each of said voltage ramps.

3. An analog to digital converter according to claim 1, wherein the ranges are decade ranges and N is 10.

4. An analog to digital converter according to claim 1, wherein said means for subsequently applying additional signals are arranged to scale the magnitude of said clock pulses from ramp to ramp by said factor N and to apply said scaled clock pulses to said integrating circuit to generate staircase ramps.

5. An analog to digital converter comprising the combination of an integrating circuit having an input and an output; means for applying an analog input signal to the input of said circuit for a predetermined interval of time to cause the output of said circuit to ramp away from a datum level; means for subsequently applying additional signals to the input of said integrating circuit to reduce the level of the output of said circuit toward said datum level in a succession of voltage ramps, each of said ramps including a plurality of fixed magnitude voltage steps, each of said ramps after the first having steps which are smaller than the steps in the preceding ramp divided by a factor N, resulting in a mean slope equal to the slope of the preceding ramp divided by a factor N, said means for subsequently applying additional signals including means for reversing the direction of the ramp voltage from one voltage ramp to the next by reversing the polarity of said additional signals; means for generating clock pulses in timed relationship with said voltage ramps; means responsive to the output of said integrating circuit for terminating each said voltage ramp when the output of said integrating circuit is restored to within a preselected approximation of said datum level, said means responsive to the output of said integrating circuit including means for terminating at least said first voltage ramp after that clock pulse which occurs next after said integrating circuit output overshoots said datum level; and means for counting the number of clock pulses occurring from the beginning of each voltage ramp to the termination thereof.

6. An analog to digital converter comprising the combination of an integrating circuit having an input and an output; means for applying an analog input signal to the input of said circuit for a predetermined interval of time to cause the output of said circuit to ramp away from a datum level; means for subsequently applying additional signals to the input of said integrating circuit to reduce the level of the output of said circuit toward a datum level in a succession of voltage ramps, each of said ramps including a plurality of fixed magnitude voltage steps, each of said ramps after the first having steps which are smaller than the steps in the preceding ramp divided by a factor N, resulting in a mean slope equal to the slope of the preceding ramp divided by a factor N; means for generating clock pulses in timed relationship with said voltage ramps; means responsive to the output of said integrating circuit to terminate each said voltage ramp when the output of said integrating circuit is restored to within a preselected approximation of said datum level and means for counting the number of clock pulses occurring from the beginning of each voltage ramp to the termination thereof, and means for individually indicating numbers corresponding to the numbers of clock pulses counted during each of said voltage ramps, wherein said means for indicating indicates one number less than the number in the counter for an odd-numbered voltage ramp and further indicates N minus the number in the counter for an even-numbered voltage ramp.

7. An analog to digital converter comprising, signal integrating means and means for supplying an analog input signal to said integrating means for a fixed time interval to cause said integrating means produces an output signal which is proportional to the time integral of the analog input signal supplied thereto and which departs from a threshold signal level in one direction, means coupled to the signal integrating means for returning the output signal at one rate of speed to a level which overshoots said threshold level, means for timing this return of the output signal to provide a first, high numerical significance digit of a digital representation of the analog signal magnitude, means for returning the overshooting output signal to said threshold level at a reduced rate of speed, and means for timing this return of the overshooting output signal to provide a second, lower significance digit of said digital representation.

8. An analog to digital converter comprising an integrating circuit having an input and an output and means for applying an analog input signal to the integrating circuit input for a fixed time interval whereupon said integrating circuit output produces an output signal which departs in one direction from a threshold signal level and is characterized as having a slope proportional to the magnitude of said input signal, means coupled to said integrating circuit input for subsequent applying thereto a first reference signal having a polarity opposite that of said input signal and a magnitude sufficient to cause the integrating circuit output signal to first return to and then overshoot said threshold signal level in the return direction, means including a second reference signal having the same polarity as said input signal and a magnitude which is a fraction of the first reference signal magnitude for returning the overshooting integrating circuit output signal to said threshold signal level, and means for individually clocking the different times required to return the integrating circuit output signal to said threshold signal level to provide first and second digits of decreasing numerical signal order to provide a digital representation of the input signal magnitude.

* * * * *